(12) United States Patent
Chung

(10) Patent No.: US 11,619,980 B2
(45) Date of Patent: Apr. 4, 2023

(54) ELECTRONIC DEVICE CHASSIS WITH EXPANSION CARD BRACKETS

(71) Applicant: Hewlett-Packard Development Company, L.P., Spring, TX (US)

(72) Inventor: Tien Liang Chung, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/606,069

(22) PCT Filed: Jul. 30, 2019

(86) PCT No.: PCT/US2019/044187
§ 371 (c)(1),
(2) Date: Oct. 25, 2021

(87) PCT Pub. No.: WO2021/021137
PCT Pub. Date: Feb. 4, 2021

(65) Prior Publication Data
US 2022/0214726 A1 Jul. 7, 2022

(51) Int. Cl.
*G06F 1/18* (2006.01)
*H05K 5/02* (2006.01)

(52) U.S. Cl.
CPC .......... *G06F 1/186* (2013.01); *H05K 5/0221* (2013.01); *H05K 5/0256* (2013.01); *G06F 2200/1639* (2013.01)

(58) Field of Classification Search
CPC ....................................................... H05K 7/00
See application file for complete search history.

(56) References Cited

U.S. PATENT DOCUMENTS

| 6,095,574 | A | 8/2000 | Dean |
| 6,278,614 | B1 * | 8/2001 | Beaman ............... H05K 7/1408 361/752 |
| 6,674,650 | B1 * | 1/2004 | Davis ...................... G06F 1/185 361/752 |
| 6,836,405 | B2 | 12/2004 | Alfonso et al. |
| 8,042,365 | B2 | 10/2011 | Morrison et al. |
| 2009/0241607 | A1 | 10/2009 | Farrow et al. |
| 2011/0248608 | A1 | 10/2011 | Tang et al. |
| 2011/0285259 | A1 | 11/2011 | Chen |
| 2014/0298868 | A1 | 10/2014 | Richards |
| 2019/0094922 | A1 | 3/2019 | Xu |

FOREIGN PATENT DOCUMENTS

| CN | 203849655 U | 9/2014 |
| CN | 104331677 | 2/2015 |

* cited by examiner

*Primary Examiner* — Jerry Wu
(74) *Attorney, Agent, or Firm* — Quarles & Brady LLP

(57) ABSTRACT

In an example, an electronic device chassis may include a back panel and an expansion card bracket which may be attached or attachable to the back panel. The expansion card bracket may include a bracket body, a lock feature to engage with an expansion card of the electronic device, and a retention loop extending from the bracket body to receive a portion of a peripheral device to lock the peripheral device to the chassis.

13 Claims, 4 Drawing Sheets

ELECTRONIC DEVICE CHASSIS WITH EXPANSION CARD BRACKETS

BACKGROUND

Electronic devices such as computing devices may include locking components to secure the electronic device and/or a chassis thereof to a fixed location to prevent theft. Further, electronic devices may also include locking components to secure the chassis thereof in a closed manner to prevent unauthorized access to the internals of the electronic device, and/or theft of the components disposed within the chassis of the electronic device.

DETAILED DESCRIPTION

As described above, electronic devices, such as computing devices, for example, may include locks, latches, cable loops, or other locking and/or securing components to prevent both theft of the electronic device itself, and also access to internals of the electronic device and/or theft of internal components disposed within a chassis of the electronic device.

Electronic devices are often used in conjunction with accessories or peripheral devices such as keyboards, mice, styluses, external or additional displays, etc. Such accessories or peripherals are often plugged into the electronic device, for example, into connectors disposed on the exterior of the chassis. Sometimes such peripherals are plugged into connectors disposed on an input/output panel of the chassis. Additionally, it is often relatively easy to plug in and unplug such peripheral devices from the connectors of the electronic device. This may pose a security risk or risk of theft of such peripheral devices if the electronic device is left alone in public or in another location where unwanted actors may have access to the electronic device. Previously, in order to avoid theft of peripheral devices, the peripheral devices may have been removed by the owner or authorized user of the electronic device and stowed in a backpack or bag and brought with the user away from the electronic device. This may be inconvenient and/or may provide an opportunity for the user to forget to bring such peripherals when the user returns to use the electronic device.

In some situations, it may be desirable to provide a security solution to be employed on an electronic device to prevent the unwanted removal of the peripheral devices from the physical location of the electronic device. Such a solution may enable a user to securely leave peripheral devices engaged with an electronic device without risking theft of such peripherals. Further, this provides a more convenient way to secure the peripherals and ensure they are always with the electronic device and ready to be used.

Implementations of the present disclosure provides expansion card brackets to be used in conjunction with chassis of electronic devices. Such expansion card brackets may include a retention loop to physically secure a portion of a peripheral device to the chassis of the electronic device. This ensures an unwanted actor cannot remove such a peripheral from the electronic device, and thus prevents risk of theft.

Figure 1:
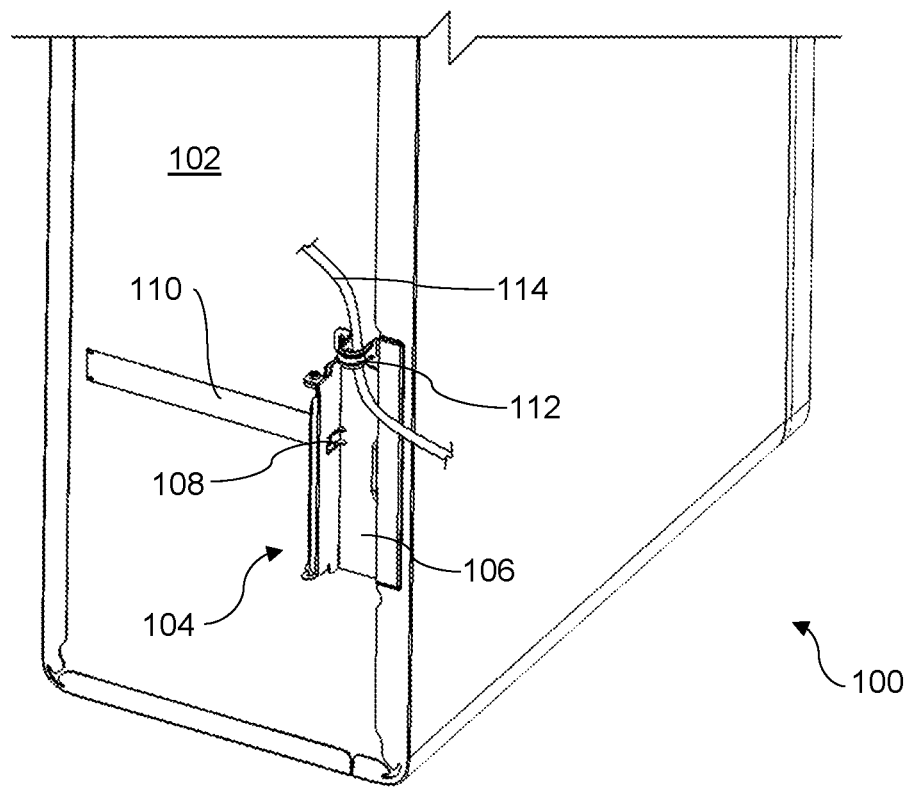
FIG. 1 is a perspective view of an example chassis for an electronic device.

Referring now to FIG. 1, a perspective view of an example chassis 100 for an electronic device is illustrated. Chassis 100 may be a housing, enclosure, framework, or other device to enclose and structurally support components of the electronic device. In some implementations, the chassis 100 may be a desktop computer tower, an all-in-one (AiO) computer housing, a display housing, a laptop computer housing, a printer housing, an additive manufacturing device housing such as a housing for a three-dimensional (3D) printer, or some other type of chassis for an electronic device with which peripheral devices may be employed.

In some implementations, the chassis 100 may include a back panel 102, and an expansion card bracket 104 which may be attached or attachable to the back panel 102. The expansion card bracket 104 may include a bracket body 106, a lock feature 108 to engage with an expansion card 110 of the electronic device, and a retention loop 112 extending from the bracket body 106 to receive a portion 114 of a peripheral device (not shown) to lock the peripheral device to the chassis 100. It should be noted that the electronic device may or may not employ or include an expansion card. Element 110 may refer to either an expansion card, if present, or a location within the chassis 100 where an expansion card could be installed. In either situation, expansion card bracket 104 may still be employed and installed on the chassis 100.

The back panel 102 may be a structural panel in some implementations. In further examples, the back panel 102 may be an input/output panel of the electronic device and may include communication ports or connectors, and/or locations or windows for communication ports or connectors. In some implementations, the back panel 102 may be constructed of sheet metal. Further, the back panel 102 may include removable portions to accommodate communication ports or connectors of components that may be added to the electronic device at a later time. In other examples, the back panel 102 may be an aesthetic panel or another portion of the chassis 100 where portions of peripheral devices may be located while in use.

The expansion card bracket 104 may be a component that is attachable to the back panel 102. The expansion card bracket 104 may include a bracket body 106, and a lock feature 108. The bracket body 106 may be a rigid or semi-rigid member with a substantially planar shape. The expansion card bracket 104 may be installed on to the chassis 100 in a manner such that the lock feature 108 is disposed adjacent to or near a slot which may receive a portion of an expansion card. The lock feature 108 may engage with the expansion card, if present in the electronic device, in such a way so as to lock the expansion card in place in its installed position. In some implementations, the lock feature 108 may be a protrusion which may interface with a complementary slot or window on the expansion card to hold the card in position. In some implementations, the lock feature 108 may be a resilient bias member and may exert a spring force on the portion of the expansion card with which it is engaged. In other examples, the lock feature may be a rigid protrusion, or a mechanical fastener, such as a screw or pin. In this context, expansion card may refer to a component which may be installed into the electronic device to enhance and/or support the operation of the electronic device. In some implementations, the expansion card may be a video card, an audio card, a network interface card, or some other type of expansion card.

The expansion card bracket 104 may also include a retention loop 112. The retention loop 112 may extend from the bracket body 106 and may be able to receive a portion 114 of a peripheral device. In some implementations, the portion 114 may be a cable or wire that may be attached to the peripheral device. The retention loop 112 may hold the portion 114 against the back panel 102 so as to prevent the removal of the peripheral device from the physical location of the electronic device.

Figure 2A:
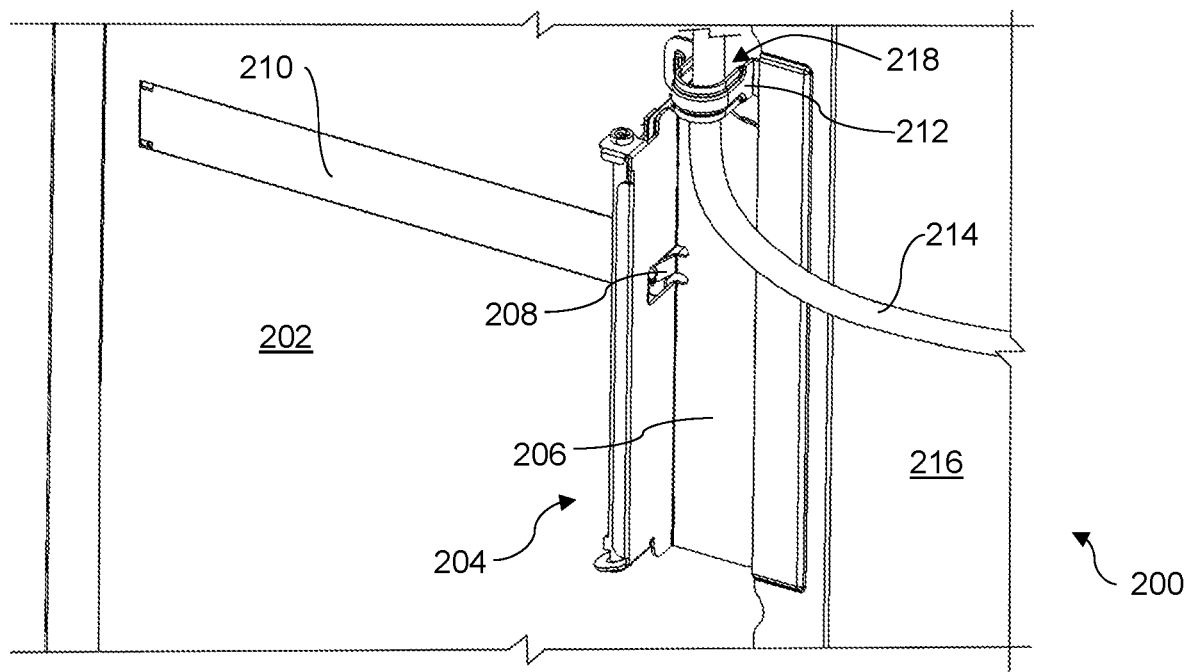
FIG. 2A is a detail perspective view of an example chassis for an electronic device.

Referring now to FIG. 2A, a detail perspective view of another example chassis 200 for an electronic device is illustrated. Example chassis 200 may be similar to example chassis 100, described above. Further, the similarly-named elements of example chassis 200 may be similar in function and/or structure to the respective elements of example chassis 100, as they are described above.

FIG. 2A illustrates a chassis 200 having a back panel 202, a removable side panel 216, and an expansion card bracket 204. Expansion card bracket 204 may be installed or attached to the back panel 202 in a position such that a lock feature 208 is near or adjacent an expansion card 210. As noted above with reference to element 110, element 210 may refer to an actual expansion card, if present, or a location in which an expansion card may be installed into or onto the chassis 200.

The expansion card bracket 204 may include a bracket body 206 and a retention loop 212 extending from the bracket body 206. The retention loop 212 may extend from the bracket body 206 so as to define a window 218 between the retention loop 212 and the back panel 202. The window 218 may be sized and/or structured so as to be able to receive a portion 214 of a peripheral device (not shown). In some implementations, the portion 214 may be a cable or wire attached to the peripheral device. In further implementations, the window 218 may be sized and/or structured so as to be able to receive multiple portions of a peripheral device or devices, for example, multiple cables or wires, each attached to a different peripheral device.

FIG. 2A illustrates the expansion card bracket 204 as being disposed in a latched position. The expansion card bracket 204 may be movable or pivotable between the latched position and an unlatched position, illustrated in FIG. 2B. When in the latched position, the retention loop 212 may define the window 218 using a portion of the back panel 202 to create a closed circumference of material around the portion(s) 214 of a peripheral device or devices. As such, when the expansion card bracket 204 is disposed in the latched position, the retention loop 212 may securely hold or retain the portion 214 of the peripheral device to the chassis 200 and/or the back panel 202 thereof.

The chassis 200 may further include a removable side panel 216. The side panel 216 may be attachable and removable from the remainder of the chassis 200 so as to provide an opening or access point for a user to gain access to components of the electronic device disposed within the chassis 200. The removable side panel 216 may be disposed adjacent the back panel 202. In some implementations, the back panel 202 and the removable side panel 216 may share a common seam or corner of the chassis 200. As such, when the removable side panel 216 is installed on or attached to the chassis 200, the removable side panel 216 may overlap a portion of the expansion card bracket 204 so as to fix or hold the expansion card bracket 204 in the latched position.

Figure 2B:
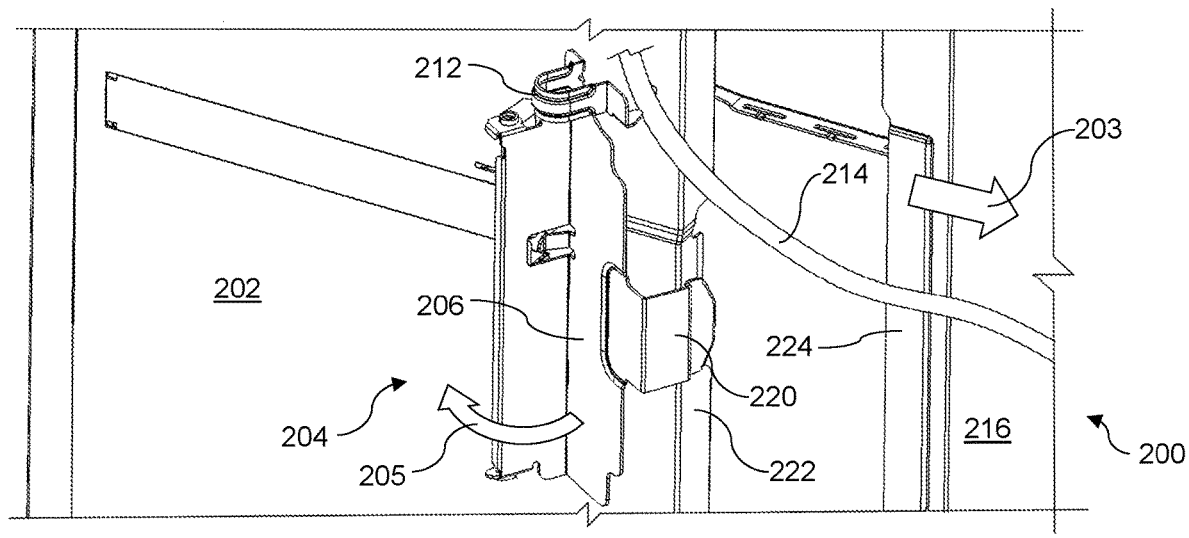
FIG. 2B is another detail perspective view of the example chassis of FIG. 2A.

Referring now to FIG. 2B, another detail perspective view of the chassis 200 of FIG. 2A is illustrated, wherein the expansion card bracket 204 is disposed in an unlatched position. The removable side panel 216 may be removed from the chassis 200, e.g., along direction 203, so as to unlock the expansion card bracket 204 and enable the expansion card bracket 204 to move or pivot to the unlatched position, for example, along direction 205, relative to the chassis 200 and/or the back panel 202 thereof. In other words, the expansion card bracket 204 may be held in the latched position, for example, by a lip 224 of the removable side panel 216 covering, holding on to, or otherwise engaging with a latch 220 of the expansion card bracket 204 when the side panel 216 is attached to the chassis 200, and, as such, when the lip 224 is removed from engagement with the latch 220 when the removable side panel 216 is removed, the expansion card bracket 204 is free to move. Further, in some implementations, when the side panel 216 is attached to the chassis 200, the lip 224 may compress or hold the latch 220 against a complementary lip 222 of the chassis 200 or the back panel 202 thereof in order to fix the expansion card bracket 204 in place in the latched position.

Upon the expansion card bracket 204 being moved or pivoted to the unlatched position, the retention loop 212 may no longer be disposed or pressing against a portion of the back panel 202, and thus the closed circumference of the window 218 retaining the portion 214 of the peripheral device to the chassis 200 may now be open. Thus, upon the expansion card bracket 204 being moved to the unlatched position, the portion 214 may be removable from the retention loop 212. Accordingly, the peripheral device may also be removable from the physical location of the electronic device when the portion 214 is removed from within the retention loop 212.

Figure 3:
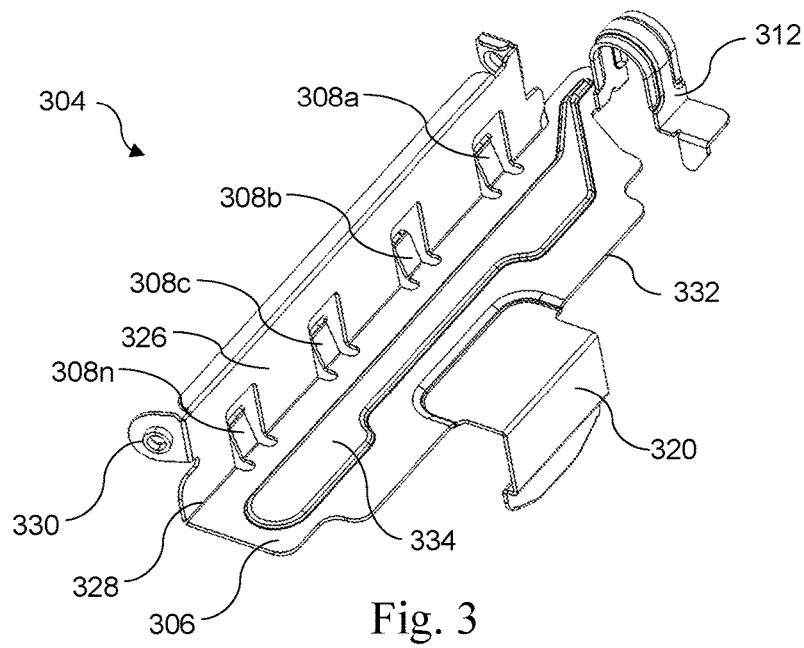
FIG. 3 is a perspective view of an example expansion card bracket.

Referring now to FIG. 3, a perspective view of an example expansion card bracket 304 is illustrated. Example expansion card bracket 304 may be similar to other example expansion card brackets described above. Further, the similarly-named elements of example expansion card bracket 304 may be similar in function and/or structure to the respective elements of other example expansion card brackets as they are described above.

Expansion card bracket 304 may include a bracket body 306. The expansion card bracket 304 may further include a first portion 326 extending laterally from a first edge 328 of the bracket body 306. In this context, extending laterally may refer to the first portion 326 extending in a direction either orthogonal to or oblique to the plane of the bracket body 306. The first portion 326 may include a plurality of lock features 308a, 308b, 308c . . . 308n to each engage with an expansion card. The lock features may be referred to collectively as lock features 308. The lock features 308 may engage with a plurality of expansion cards, if present in an electronic device with which the expansion card bracket 304 is engaged. Further, in some implementations, only one of, or less than the total number of lock features 308 may actually engage with an expansion card. This may occur if there is a lesser number of expansion cards installed in the electronic device than there are lock features 308.

The expansion card bracket 304 may also include a pivot tab 330 disposed at a distal end of the first portion 326. The pivot tab 330 may pivotally engage the expansion card bracket 304 with a chassis of the electronic device with which the expansion card bracket 304 is engaged. The pivot tab 330 may enable the expansion card bracket 304 to move between a latched position and an unlatched position. In some implementations, the expansion card bracket 304 may include more than one pivot tab 330 in order to enable such movement. In further implementations, each pivot tab 330 may engage with a complementary pivot disposed on a back panel of the chassis such that the expansion card bracket 304 is pivotable between the latched and unlatched positions. The complementary pivot may be a pivot rod or bar, hinge component, fastener, or another pivot tab or plurality of pivot tabs, or a combination thereof.

The expansion card bracket 304 may further include a retention loop 312 extending from the bracket body 306. The retention loop 312 may receive a portion or cable of a peripheral device and, as such, may retain, lock, and/or secure the peripheral device to the chassis of the electronic device. In some implementations, the retention loop 312 may extend from the bracket body 306 in a substantially U-shaped fashion, such that the retention loop 312 engages or mates to the back panel so as to define a window through which the peripheral device portion or cable may pass when the expansion card bracket 304 is in the latched position. In other implementations, the retention loop 312 may have an oblong structure, a V-shaped or L-shaped structure, or another type of structure that is capable of defining a window to receive a portion of a peripheral device when mated or pressed against the back panel.

Further, the expansion card bracket 304 may also include a latch 320 extending from a second edge 332 of the bracket body 306. The second edge 332 may be on an opposite side of the bracket body 306 from the first edge 328. The latch 320 may engage with a removable side panel of the chassis of the electronic device with which the expansion card bracket 304 is engaged in order to hold, lock, or fix the expansion card bracket 304 to the chassis in the latched position. In some implementations, the latch 320 may extend from the bracket body 306 in a direction substantially opposite to the direction in which the first portion 326 extends from the bracket body 306. In other words, in some implementations, the first portion 326 may extend from the bracket body 306 in a direction away from the back panel when the expansion card bracket 304 is in the latched position, and the latch 320 may extend in a direction towards the back panel and/or the remainder of the chassis so as to be able to engage with the removable side panel.

In some examples, the expansion card bracket 304, or the bracket body 306 thereof, may include a strengthening feature 334. Such strengthening feature may be an embossed portion, a ribbed portion, or a portion having another type of deformation or additional material in order to increase the rigidity of the bracket body 306 and/or the expansion card bracket 304 as a whole. Such a strengthening feature 334 may assist the expansion card bracket 304 in retaining the peripheral device portion to the electronic device by making the expansion card bracket 304 more difficult to bend and deform in a manner that may enable the peripheral device portion to be removed from the retention loop through brute force.

In some implementations, any or all of the features of the expansion card bracket 304 (e.g., the bracket body 306, the first portion 326, the lock feature(s) 308, the retention loop 312, and/or the latch 320) may be formed in a unitary manner. In other implementations, any of such features may be assembled on to the expansion card bracket 304 using mechanical fasteners, adhesives, welding, or other methods. In some implementations, the expansion card bracket 304 may be formed by bending and/or stamping a single piece of sheet metal. In other implementations, the expansion card bracket 304 and its constituent components and features may be molded using metallic injection molding (MIM), plastic injection molding, etc. In yet further implementations, the expansion card bracket 304 may be formed using additive manufacturing techniques.

Figure 4A:
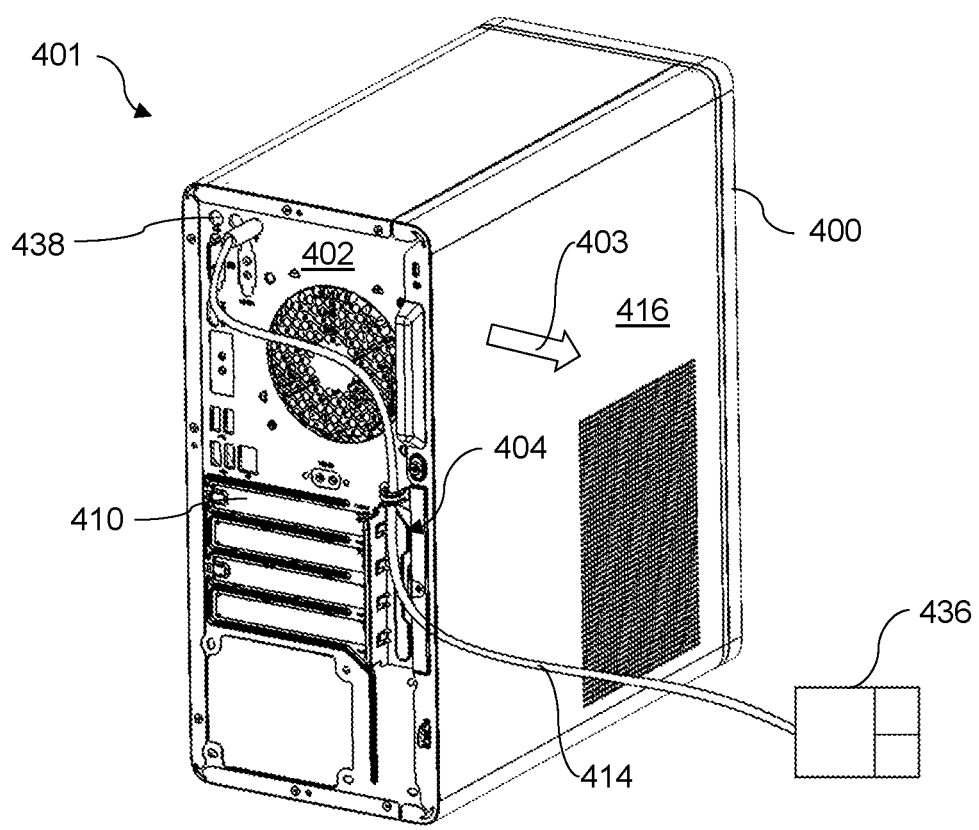
FIG. 4A is a perspective view of an example computing device.
Figure 4B:
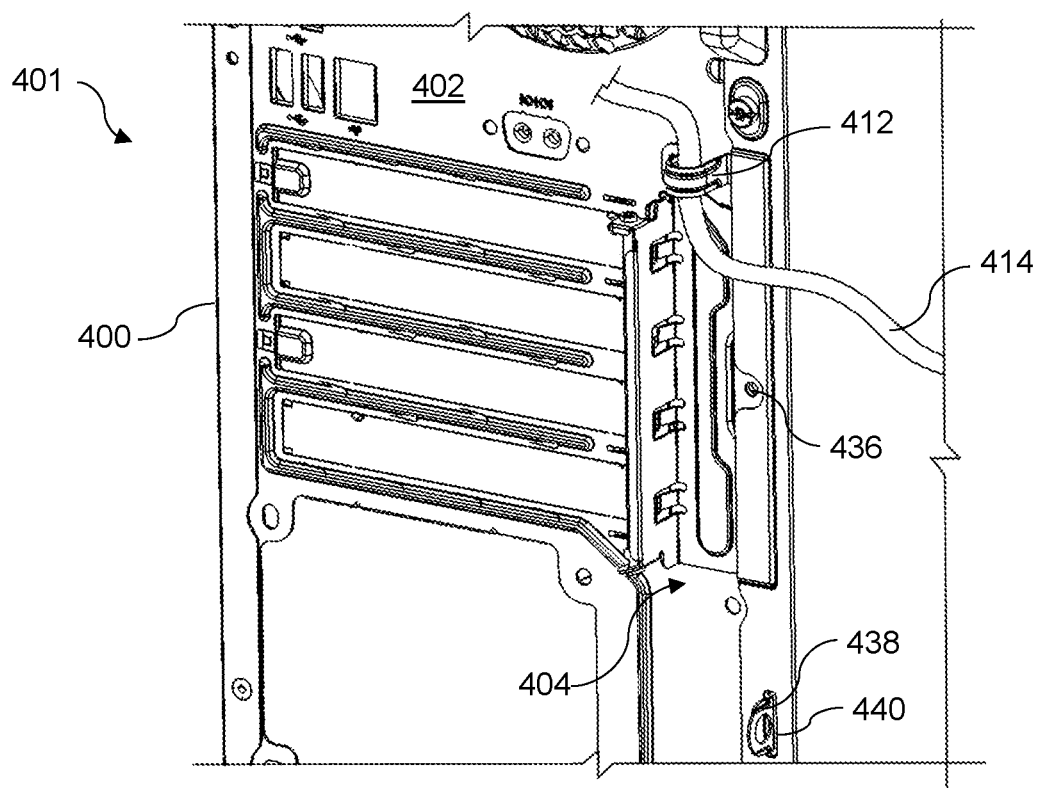
FIG. 4B is a detail perspective view of the example computing device of FIG. 4A.

Referring now to FIGS. 4A and 4B, a perspective view and a detail perspective view of an example computing device 401 are illustrated, respectively. Example computing device 401 may include an example chassis 400. Example chassis 400 may be similar to other example chassis described above. Further, the similarly-named elements of example chassis 400 may be similar in function and/or structure to the respective elements of other example chassis as they are described above.

The chassis 400 may enclose components of the computing device such as processors, storage drives, motherboards or other printed circuit boards (PCBs), memory, or other suitable components for a computing device. In some implementations, the computing device 401 may be a desktop computer, as illustrated, although other types of computing devices e.g., AiO computers, laptop computers, displays, printers or other imaging devices, or 3D printers are also contemplated and considered within the scope of the present disclosure.

The chassis 400 may include a back panel 402 and a removable side panel 416 adjacent to the back panel 402. The back panel 402 may be an input/output (I/O) panel having a plurality of connectors 438 and/or data communication interfaces, in some implementations. In some implementations, the back panel 402 may include recesses or openings such as expansion bays 410 for access to connectors and communication interfaces on computing components installed within the chassis 400. The removable side panel 416 may be removable from the remainder of the chassis 400, for example, along direction 403. This panel may enable a user to access the internal components of the computing device disposed within the chassis 400.

The computing device 401 may further include an expansion card bracket 404 pivotably engaged with the back panel 402 of the chassis 400. The expansion card bracket 404 may be movable between a latched position and an unlatched position, relative to the back panel 402. The expansion card bracket 404 may include a retention loop 412 to receive a cable 414 of a peripheral device 436. The peripheral device 436 may be a mouse or pointer device, as illustrated. In other implementations, the peripheral device may be another type of accessory suitable for use with the computing device 401, e.g., a keyboard, speakers, a display, headphones, etc. The cable 414 may be inserted into a connector 438 on the back panel 402 and, as such, may hang or run near the expansion card bracket 404. As such, it may be convenient to retain the cable 414 within the retention loop 412 in order to secure the peripheral device 436 to the computing device, thus avoiding the risk of theft of such a peripheral device. The retention loop 412 may lock the cable 414 to the back panel 402 when the expansion card bracket 404 is disposed in the latched position. Further, the expansion card bracket 404 may be secured or held in the latched position by the removable side panel 416 when the side panel 416 is attached to the chassis 400. In order to remove the cable 414 from the retention loop 412, the removable side panel 416 may first be removed from the chassis 400, thus allowing the expansion card bracket 404 to move to the unlatched position.

In some implementations, the back panel 402 may further include a lock tab 438 to receive a locking device to secure the removable side panel 416 to the chassis 400 and/or the back panel 402. The lock tab 438 may be a protrusion having an opening to receive a portion of a locking device, e.g., a shank of a padlock. The lock tab 438 may extend through a tab slot 440 in a lip of the side panel 416 as the side panel 416 is attached to the chassis 400. Once attached, a locking device such as a padlock may be passed through the lock tab 438 in order to lock the removable side panel 416 to the chassis 400, and thus preventing the movement of the expansion card bracket 404 and subsequent removal of the cable 414 and peripheral device 436 from the computing device 401. As an additional layer of security, in some implementations, the expansion card bracket 404 may further include a fastener portion 436 which may receive a mechanical fastener (not shown) such as a screw to further secure the expansion card bracket 404 to the chassis 400. In such an example, the help of a tool to remove the fastener may be needed in order to enable the expansion card bracket 404 to move from the latched position to the unlatched position, even after the removable side panel 416 is removed.

What is claimed is:

1. A chassis for an electronic device, comprising: a back panel; and an expansion card bracket attachable to the back panel, the expansion card bracket comprising: a bracket body; a lock feature to lock an expansion card; and a retention loop extending from the bracket body to lock a cable of a peripheral device to the back panel of the chassis; and a removable side panel adjacent the back panel, wherein the removable side panel is to fix the expansion card bracket in the latched position when attached to the chassis, and wherein the expansion card bracket is able to move to the unlatched position when the removable panel is removed from the chassis.

2. The chassis of claim 1, wherein the expansion card bracket is movable between a latched position, wherein the retention loop is to retain the portion of the peripheral device to the chassis when disposed in the latched position, and an unlatched position, wherein the portion of the peripheral device is removable from the retention loop.

3. An expansion card bracket, comprising: a bracket body; a first portion extending laterally from a first edge of the bracket body, the first portion having a lock feature to lock an expansion card; a pivot tab disposed at a distal end of the first portion; the pivot tab to pivotally engage the expansion card bracket with a back panel of a chassis for a computing device; a retention loop extending from the bracket body to lock a cable of a peripheral device to the back panel; and a latch extending from a second edge of the bracket body, opposite the first edge, the latch to engage with a removable side panel of the chassis adjacent to the back panel and to lock the expansion card bracket to the chassis.

4. The expansion card bracket of claim 3, wherein the pivot tab is to engage with a complementary pivot of a back panel of the chassis such that the expansion card bracket is pivotable between a latched position and an unlatched position.

5. The expansion card bracket of claim 4, wherein the retention loop is to retain the cable of the peripheral device to the back panel of the chassis when the expansion card bracket is in the latched position.

6. The expansion card bracket of claim 3, wherein first portion includes a plurality of lock features to engage with a plurality of expansion cards engaged with the chassis.

7. The expansion card bracket of claim 3, wherein the latch extends from the bracket body in a direction substantially opposite to the direction in which the first portion extends from the bracket body.

8. A computing device, comprising: a chassis to enclose components of the computing device, the chassis having a back panel and a removable side panel adjacent the back panel; and an expansion card bracket pivotably engaged with the back panel of the chassis and movable between a latched position when the removable side panel is to secure the expansion card bracket and an unlatched position, the expansion card bracket comprising: a bracket body; a lock feature to lock an expansion card; and a retention loop extending from the expansion card bracket, the retention loop to receive a cable of a peripheral device; and the retention loop is to lock the cable of the peripheral device to the back panel when the expansion card bracket is disposed in the latched position.

9. The computing device of claim 8, wherein the retention loop is to lock the cable of the peripheral device to the back panel when the expansion card bracket is disposed in the latched position.

10. The computing device of claim 9, wherein the removable side panel is to secure the expansion card bracket in the latched position when attached to the chassis.

11. The computing device of claim 8, wherein the cable of the peripheral device is removable from the retention loop when the expansion card bracket is disposed in the unlatched position.

12. The computing device of claim 8, wherein the back panel is an Input/Output (I/O) panel of the chassis.

13. The computing device of claim 8, wherein the back panel further includes a lock tab to receive a locking device to secure the removable side panel to the back panel.

* * * * *